United States Patent
Houck

(10) Patent No.: US 11,714,002 B2
(45) Date of Patent: *Aug. 1, 2023

(54) OPTICAL FILTER FOR AN OPTICAL SENSOR DEVICE

(71) Applicant: VIAVI Solutions Inc., Chandler, AZ (US)

(72) Inventor: William D. Houck, Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/818,087

(22) Filed: Aug. 8, 2022

(65) Prior Publication Data

US 2022/0381610 A1    Dec. 1, 2022

Related U.S. Application Data

(63) Continuation of application No. 17/228,102, filed on Apr. 12, 2021, now Pat. No. 11,408,767.

(51) Int. Cl.
| | |
|---|---|
| *G01J 3/02* | (2006.01) |
| *G01N 21/25* | (2006.01) |
| *G01J 3/12* | (2006.01) |
| *H01L 27/146* | (2006.01) |

(52) U.S. Cl.
CPC .......... *G01J 3/0229* (2013.01); *G01J 3/0208* (2013.01); *G01J 3/12* (2013.01); *G01N 21/255* (2013.01); *G01J 2003/1226* (2013.01); *H01L 27/14625* (2013.01)

(58) Field of Classification Search
CPC ........ G01J 3/02; G01J 3/12; G01J 3/28; G01J 3/14; G01J 3/18; G01J 3/26; G01J 3/0229; G01J 3/0208; G01J 2003/1226; G01N 21/255; H01L 27/14625
See application file for complete search history.

(56) References Cited

U.S. PATENT DOCUMENTS

| | | | | |
|---|---|---|---|---|
| 6,031,619 | A * | 2/2000 | Wilkens | G02B 6/06 250/226 |
| 9,377,396 | B2 | 6/2016 | Goldring et al. | |
| 9,587,982 | B2 | 3/2017 | Goldring et al. | |
| 10,323,982 | B2 | 6/2019 | Goldring et al. | |
| 10,704,954 | B2 | 7/2020 | Goldring et al. | |
| 11,408,767 | B1 | 8/2022 | Houck | |
| 2015/0002629 | A1* | 1/2015 | Wei | H04N 9/04553 348/46 |

* cited by examiner

*Primary Examiner* — Abdullahi Nur
(74) *Attorney, Agent, or Firm* — Harrity & Harrity, LLP

(57) ABSTRACT

An optical system includes an optical element and an optical filter with a first set of channels and a second set of channels respectively associated with a first region and a second region of the optical filter. The optical element causes first light beams and second light beams associated with a subject to respectively fall incident on the first region within a first incidence angle range and on the second region within a second incidence angle range. A first channel, of the first set of channels, passes, based on the first incidence angle range, a set of the first light beams that are associated with a first subrange of a particular wavelength range. A second channel, of the second set of channels, passes, based on the second incidence angle range, a set of the second light beams that are associated with a second subrange of the particular wavelength range.

20 Claims, 9 Drawing Sheets

OPTICAL FILTER FOR AN OPTICAL SENSOR DEVICE

RELATED APPLICATION

This application is a continuation of U.S. patent application Ser. No. 17/228,102, filed Apr. 12, 2021 (now U.S. Pat. No. 11,408,767), which is incorporated herein by reference in its entirety.

BACKGROUND

An optical sensor device may be utilized to capture information concerning light. For example, the optical sensor device may capture information relating to a set of wavelengths associated with the light. The optical sensor device may include a set of sensor elements (e.g., optical sensors, spectral sensors, and/or image sensors) that capture the information. For example, an array of sensor elements may be utilized to capture information relating to multiple wavelengths. The sensor element array may be associated with an optical filter. The optical filter may include one or more channels that respectively pass particular wavelengths to sensor elements of the sensor element array.

SUMMARY

In some implementations, an optical sensor device includes an optical element; an optical filter that includes a first set of channels associated with a first region of the optical filter and a second set of channels associated with a second region of the optical filter; an optical sensor that includes a set of sensor elements, wherein: the optical element is configured to cause first light beams associated with a subject to fall incident on the first region of the optical filter within a first incidence angle range and to cause second light beams associated with the subject to fall incident on the second region of the optical filter within a second incidence angle range; a first channel, of the first set of channels, is configured to, based on receiving a portion of the first light beams that fall incident on the first channel within the first incidence angle range, pass a set of the first light beams that are associated with a first subrange of a particular wavelength range to a first subset of sensor elements of the set of sensor elements; and a second channel, of the second set of channels, is configured to, based on receiving a portion of the second light beams that falls incident on the second channel within the second incidence angle range, pass a set of the second light beams that are associated with a second subrange of the particular wavelength range to a second subset of sensor elements of the set of sensor elements, wherein a composition of the first channel matches a composition of the second channel.

In some implementations, an optical system includes an optical element; an optical filter that includes a first set of channels associated with a first region of the optical filter and a second set of channels associated with a second region of the optical filter, wherein: the optical element is configured to cause first light beams associated with a subject to fall incident on the first region of the optical filter within a first incidence angle range; the optical element is configured to cause second light beams associated with the subject to fall incident on the second region of the optical filter within a second incidence angle range; a first channel, of the first set of channels, and a second channel, of the second set of channels, are configured to respectively pass light beams associated with a particular wavelength range; the first channel is configured to, based on receiving a portion of the first light beams that fall incident on the first channel within the first incidence angle range, pass a set of the first light beams that are associated with a first subrange of the particular wavelength range; and the second channel is configured to, based on receiving a portion of the second light beams that fall incident on the second channel within the second incidence angle range, pass a set of the second light beams that are associated with a second subrange of the particular wavelength range.

In some implementations, an optical filter includes a first set of channels associated with a first region of the optical filter and a second set of channels associated with a second region of the optical filter, wherein: the first set of channels are configured to receive, from an optical element, first light beams, wherein the first light beams are configured by the optical element to fall incident on the first region of the optical filter within a first incidence angle range; the second set of channels are configured to receive, from the optical element, second light beams, wherein the second light beams are configured by the optical element to fall incident on the second region of the optical filter within a second incidence angle range; a first channel, of the first set of channels, is configured to, based on receiving a portion of the first light beams that fall incident on the first channel within the first incidence angle range, pass a set of the first light beams that are associated with a first subrange of a particular wavelength range; and a second channel, of the second set of channels, is configured to, based on receiving a portion of the second light beam that falls incident on the second channel within the second incidence angle range, pass a set of the second light beams that are associated with a second subrange of the particular wavelength range, wherein a composition of the first channel matches a composition of the second channel.

DETAILED DESCRIPTION

Figure 1A:
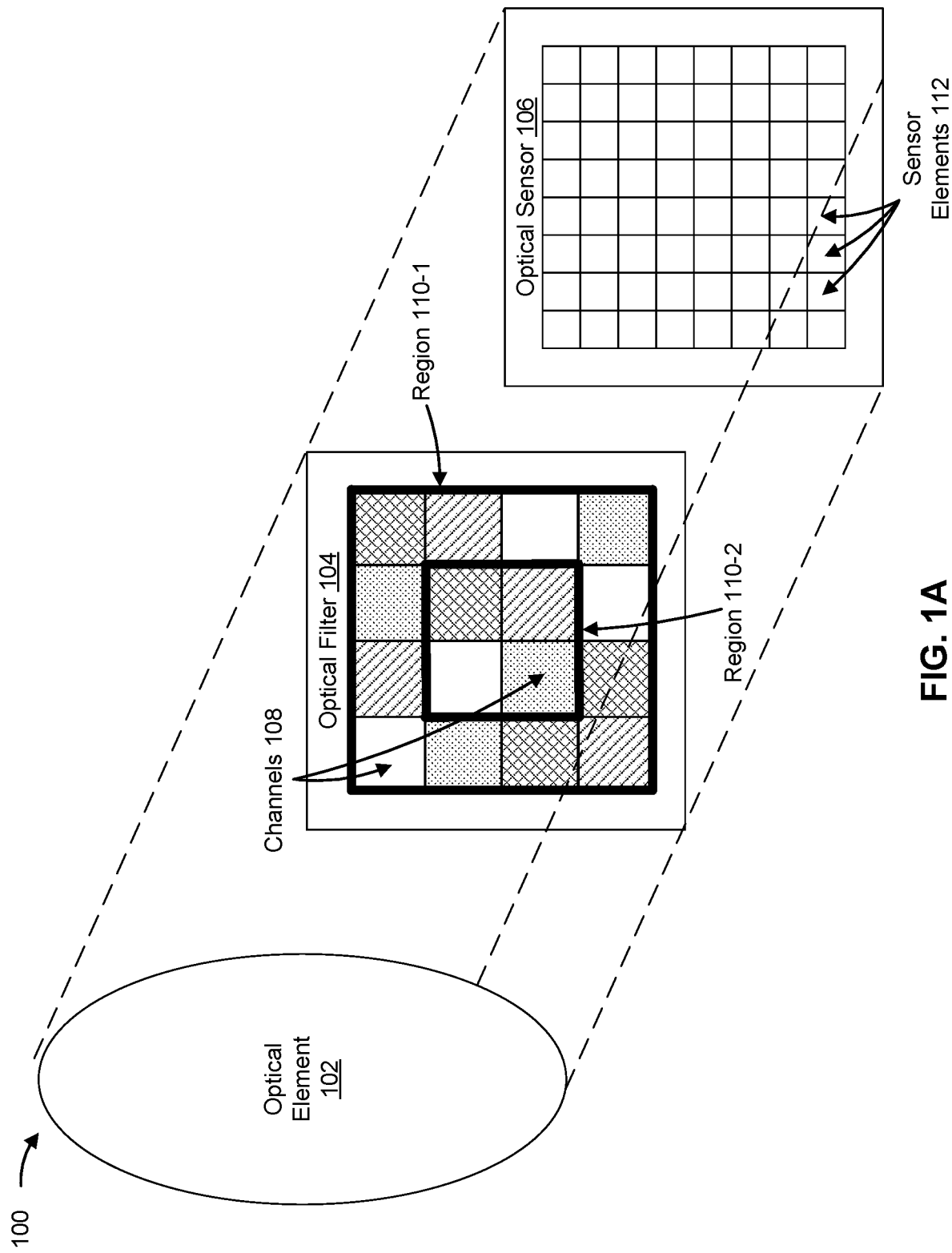
FIGS. 1A-1D are diagrams of an overview of an example implementation described herein.

The following detailed description of example implementations refers to the accompanying drawings. The same reference numbers in different drawings may identify the same or similar elements. The following description uses a spectrometer as an example. However, the techniques, principles, procedures, and methods described herein may be used with any sensor, including but not limited to other optical sensors and spectral sensors.

A conventional optical sensor device, such as a spectrometer, may be configured to determine spectral information associated with light (e.g., ambient light) captured by the optical sensor device. The light may enter the optical sensor device and may be received by an optical filter and an optical sensor of the optical sensor device (e.g., wherein the optical filter is disposed on the optical sensor). The optical filter may include a set of optical channels designed to respectively pass light in different wavelength ranges to a set of sensor elements of the optical sensor. This allows the optical sensor to determine spectral information associated with the light that relates to the different wavelength ranges. However, the optical sensor is only able to determine spectral information associated with individual wavelength ranges respectively associated with the set of optical channels.

Some implementations described herein provide an optical sensor device that includes an optical element, an optical filter, and an optical sensor. The optical element may be configured to cause light beams that originate from a subject (e.g., a subject to be analyzed) to fall incident at different incidence angles on different regions of a surface of the optical filter. For example, the optical element may cause first light beams to fall incident on a first region of the optical filter within a first incidence angle range and may cause second light beams to fall incident on a second region of the optical filter within a second incidence angle range.

The first region of the optical filter may include a first channel that is configured to pass light beams associated with a particular wavelength range and the second region of the optical filter may include a second channel that is configured to pass light beams associated with the particular wavelength range. For example, the first channel and the second channel may be configured to pass red light beams (e.g., light beams associated with a wavelength range of approximately 620 to 750 nanometers). In some implementations, the first channel and the second channel may have matching compositions and each may have an angle-dependent wavelength characteristic. The first channel may be configured to pass light beams associated with a first subrange of the particular wavelength range (e.g., when the light beams fall incident on the channel within the first incidence angle range) and the second channel may be configured to pass light beams associated with a second subrange of the particular wavelength range (e.g., when the light beams fall incident on the channel within the second incidence angle range). For example, the first channel may be configured to pass light beams associated with a first subrange of red light (e.g., light beams associated with a wavelength range of approximately 720 to 750 nanometers) and the second channel may be configured to pass light beams associated with a second subrange of red light (e.g., light beams associated with a wavelength range of approximately 705 to 720 nanometers).

In some implementations, the first channel may pass a set of the first light beams that are associated with the first subrange of the particular wavelength range to a first set of sensor elements of the optical sensor. The second channel may pass a set of the second light beams that are associated with the second subrange of the particular wavelength range to a second set of sensor elements of the optical sensor. The optical sensor may generate and provide sensor data (e.g., that includes information related to the set of the first light beams and the set of the second light beams) to one or more processors. The one or more processors may process the sensor data to determine spectral information associated with the subject.

In this way, the one or more processors may be able to identify multiple wavelength subranges associated with light beams that are passed by channels of the optical filter and received by sensor elements of the optical sensor. Accordingly, the one or more processors increase the optical sensor device's ability to determine accurate spectral information associated with light that enters the optical sensor device, as compared to a conventional optical sensor device. Moreover, the one or more processors increase a precision of the spectral information over a wider set of wavelength ranges as compared to a conventional optical sensor device.

Further, a same channel may be positioned within different regions of the optical filter to obtain information related to multiple wavelength subranges. This reduces a complexity of designing, manufacturing, and/or maintaining the optical filter and/or the optical sensor device. Further, the optical sensor device may utilize an optical element (e.g., a non-telecentric lens) that may already be part of a user device. This allows the optical sensor device to be incorporated into user devices, such as mobile phone devices, that require a small form factor, which may not be possible for a package that includes a conventional optical sensor device that includes its own optical element.

FIGS. 1A-1D are diagrams of an overview of an example implementation 100 described herein. As shown in FIG. 1A, example implementation 100 includes an optical element 102, an optical filter 104, and an optical sensor 106. The optical element 102, the optical filter 104, and the optical sensor 106 may be associated with an optical sensor device, which is described in more detail elsewhere herein.

The optical element 102 may be configured to cause light beams associated with a subject (e.g., that originate from the subject) to fall incident on a surface (e.g., an input surface) of the optical filter 104 at different incidence angles, as further described herein. That is, the optical element 102 may cause at least some light beams to have a trajectory that is not parallel to a normal line of the surface of the optical filter 104 after passing through the optical element 102. As shown in FIG. 1A, the optical element 102 may include a lens, such as a non-telecentric lens. In some implementations, the optical element 102 may include an aperture (e.g., as described herein in relation to FIGS. 2A and 2B) and/or one or more other optical elements, such as a reflective optical element, a transmissive optical element, a diffractive optical element, and/or a refractive optical element.

As further shown in FIG. 1A, the optical filter 104 may include a plurality of channels 108 that are included in a plurality of regions 110 of the optical filter 104. For example, the optical filter 104 may include a first region 110-1 (e.g., an outer region indicated by a larger, square outline in FIG. 1A) that includes a first set of channels 108 (e.g., twelve channels 108, as shown in FIG. 1A) and a second region 110-2 (e.g., an inner region indicated by a smaller, square outline in FIG. 1A) that includes a second set of channels 108 (e.g., four channels 108, as shown in FIG. 1A).

As further described herein, the optical element 102 may cause first light beams associated with a subject to fall incident on the first region 110-1 of the optical filter 104 within a first incidence angle range and/or may cause second light beams associated with the subject to fall incident on the second region 110-2 of the optical filter 104 within a second incidence angle range. For example, the optical element 102 may cause the first light beams to fall incident on the first region 110-1 within an incidence angle range of 10 to 25 degrees (e.g., greater than 10 degrees and less than or equal to 25 degrees) of a normal line of a surface (e.g., the input surface) of the optical filter 104, and may cause the second light beams to fall incident on the second region 110-2 within an incidence angle range of 0 to 10 degrees (e.g., greater than 0 degrees and less than or equal to 10 degrees) of the normal line of the surface of the optical filter 104.

The plurality of channels 108 may respectively pass light beams associated with different wavelength ranges to sensor elements 112 of the optical sensor 106. For example, as shown in FIG. 1A, a first channel 108 (e.g., indicated by no shading and no patterning) may pass light beams associated with a first wavelength range to a first set of sensor elements 112 (e.g., that comprises one or more sensor elements 112) of the optical sensor 106, a second channel 108 (e.g., indicated by gray shading) may pass light beams associated with a second wavelength range to a second set of sensor elements 112 of the optical sensor 106, a third channel 108 (e.g., indicated by diamond patterning) may pass light beams associated with a third wavelength range to a third set of sensor elements 112 of the optical sensor 106, and so on.

In some implementations, the plurality of channels 108 may include one or more groups of channels 108 that pass light beams associated with a same wavelength range. For example, as shown in FIG. 1A, a group of first channels 108 (e.g., indicated by no shading and no patterning), where three of the first channels 108 are included in the first region 110-1 and one of the first channels 108 is included in the second region 110-2, may each be configured to pass light beams associated with the first wavelength range. Accordingly, a composition of a first channel 108 may match (e.g., be the same as or similar to) a composition of each of the other first channels 108 of the group of first channels 108. For example, each first channel 108 may comprise a set of thin film layers that comprise a same or similar number of thin film layers, a same or similar arrangement of the thin film layers, and/or a same or similar thickness of the thin film layers, among other examples.

In some implementations, the optical filter 104 may have an angle-dependent wavelength characteristic. For example, a channel 108 may be configured to have an "angle shift," such that the channel 108 may pass light beams associated with a first subrange of a wavelength range (e.g., that the channel 108 is configured to pass) when the light beams fall incident on the channel 108 within a first incidence angle range, may pass light beams associated with a second subrange of the wavelength range when the light beams fall incident on the channel 108 within a second incidence angle range, may pass light beams associated with a third subrange of the wavelength range when the light beams fall incident on the channel 108 within a third incidence angle range, and so on. In some implementations, the channel 108 may be configured to pass light beams associated with shorter wavelengths as the light beams fall incident on the channel 108 at greater incidence angles.

In some implementations, the optical filter 104 may include an optical interference filter (e.g., a thin film optical interference filter). The optical interference filter may have an angle dependent wavelength characteristic, and the angle dependent wavelength characteristic may be represented by the following equation:

$$\lambda_\theta = \lambda_0 \left[1 - \frac{n_0}{n_e}\sin^2\theta\right]^{\frac{1}{2}},$$

where $\lambda_\theta$ represents a peak wavelength at incidence angle $\theta$, $\lambda_\theta$ represents a peak wavelength at incidence angle $\theta$, $n_0$ represents a refractive index of the incidence medium, $n_e$ represents an effective index of the optical interference filter, and $\theta$ is the incidence angle of a light beam. Additionally, or alternatively, the optical filter 104 may include, for example, a spectral filter, a multispectral filter, a bandpass filter, a blocking filter, a long-wave pass filter, a short-wave pass filter, a dichroic filter, a linear variable filter (LVF), a circular variable filter (CVF), a Fabry-Perot filter (e.g., a Fabry-Perot cavity filter), a Bayer filter, a plasmonic filter, a photonic crystal filter, a nanostructure and/or metamaterial filter, an absorbent filter (e.g., comprising organic dyes, polymers, and/or glasses, among other examples), and/or the like.

As further shown in FIG. 1A, the optical sensor 106 may include a plurality of sensor elements 112 (e.g., an array of sensor elements, also referred to herein as a sensor array), each configured to obtain information. For example, a sensor element 112 may provide an indication of intensity of light beams that fall incident on the sensor element 112 (e.g., active/inactive, or a more granular indication of intensity). The optical sensor 106 may be configured to collect the information obtained by the one or more sensor elements 112 to generate sensor data.

As further shown in FIG. 1A, the optical element 102 may be disposed over the optical filter 104, which may be disposed over the optical sensor 106. In some implementations, the optical element 102 may be directly disposed on the optical filter 104 or may be separated from the optical filter 104 by a gap (e.g., a free space gap or a gap filled with a light transmissive medium, such as epoxy). Additionally, or alternatively, the optical filter 104 may be directly disposed on the optical sensor 106 or may be separated from the optical sensor 106 by a gap (e.g., a free space gap or a gap filled with a light transmissive medium, such as epoxy).

Figure 1B:
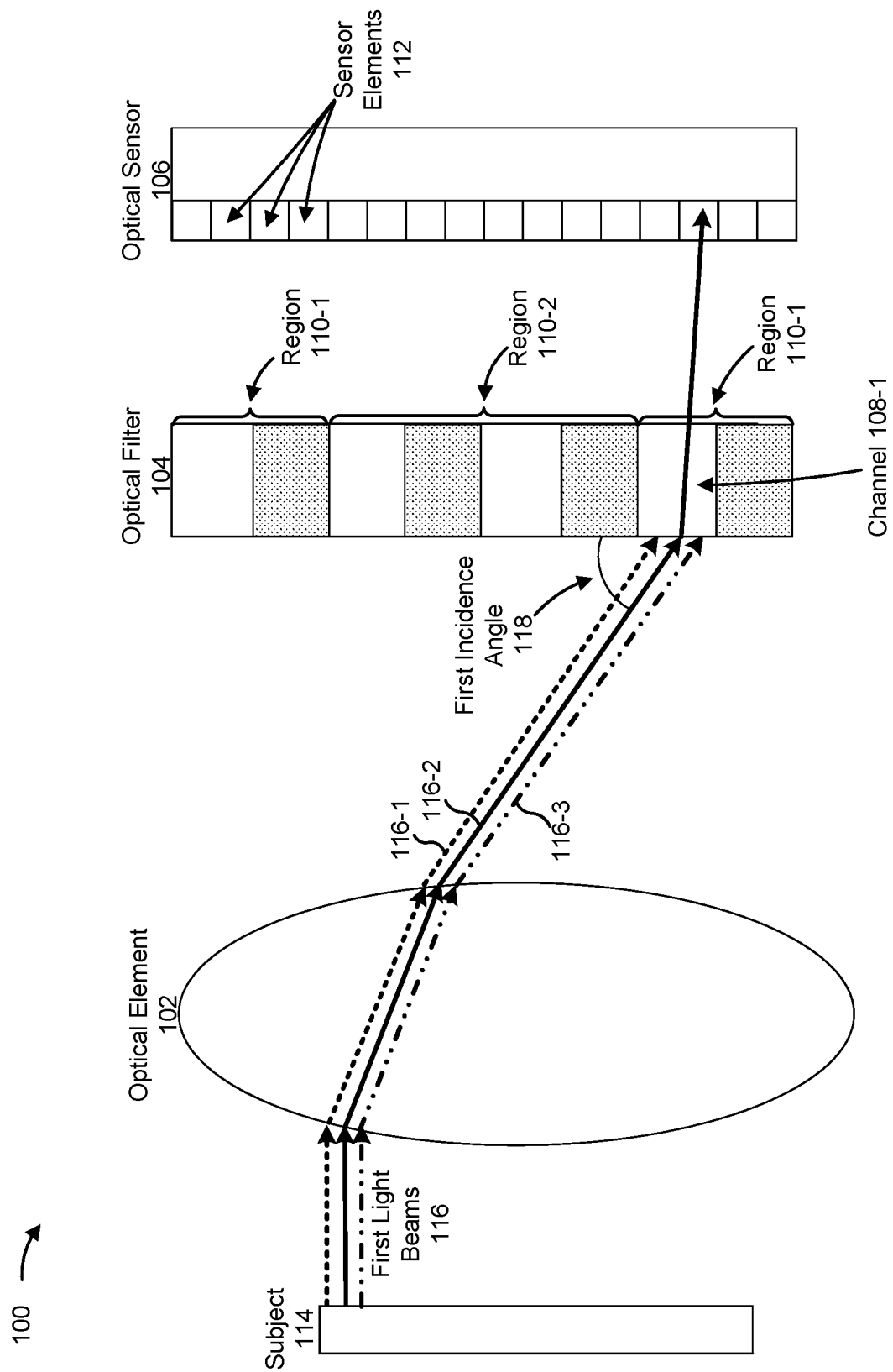
Figure 1C:
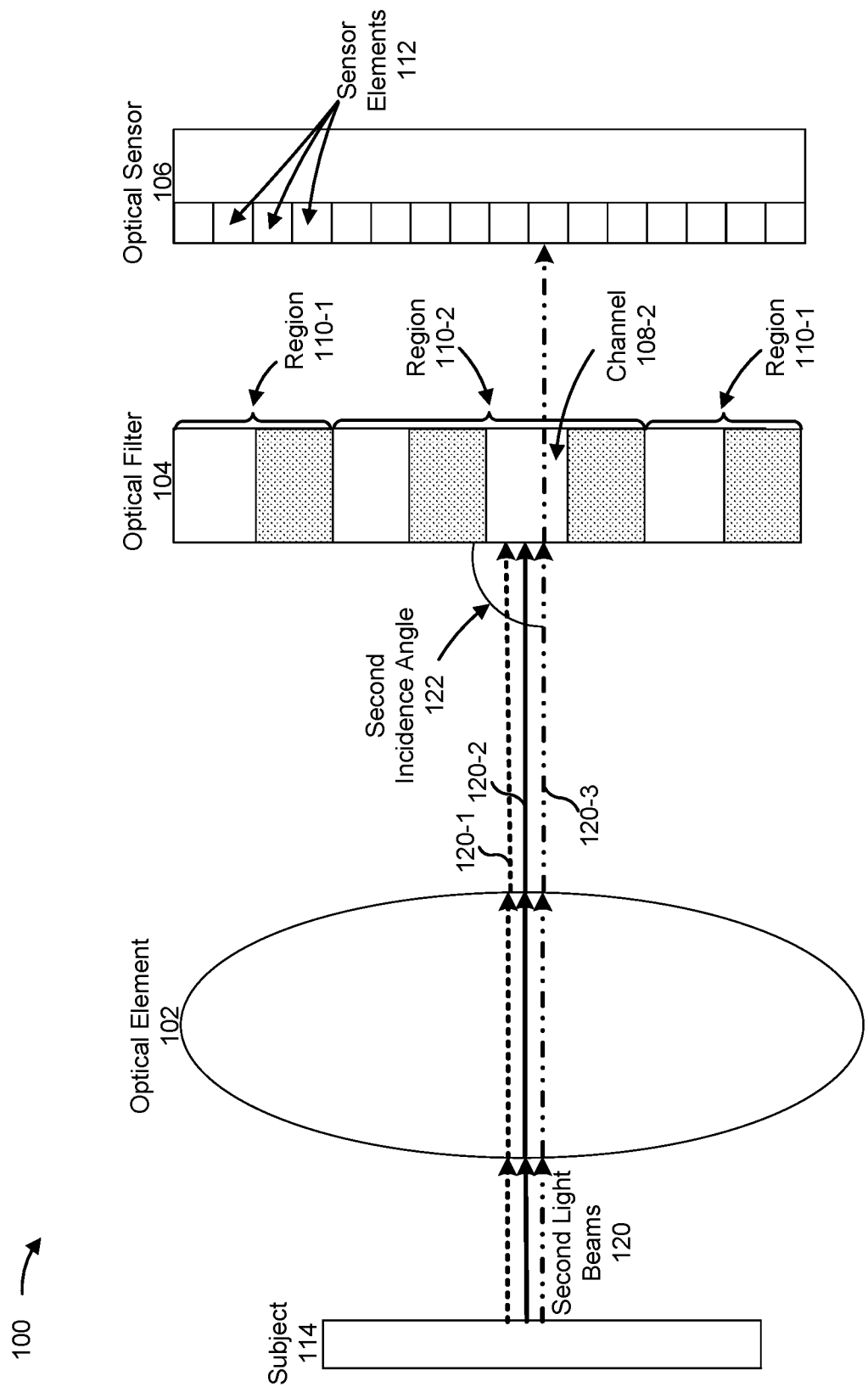

As shown in FIGS. 1B-1C, the optical sensor device associated with the optical element 102, the optical filter 104, and the optical sensor 106 may be configured to capture information relating to a subject 114. In some implementations, one or more light beams may originate at the subject 114 (e.g., emit from one or more points of the subject 114 or reflect from the one or more points of the subject 114) and may be received by the optical sensor device.

As shown in FIG. 1B, first light beams 116 associated with a particular wavelength range (e.g., visible light, infrared light, or ultraviolet light, among other examples) may originate at the subject 114. The first light beams 116 may comprise sets of first light beams 116 that are associated with individual subranges of the particular wavelength range. For example, as shown in FIG. 1B, a first set of first light beams 116-1 (e.g., indicated by a dashed line) may be associated with a first subrange of the particular wavelength range, a second set of first light beams 116-2 (e.g., indicated by a solid line) may be associated with a second subrange of the particular wavelength range, and a third set of first light beams 116-3 (e.g., indicated by a dashed-and-dotted line) may be associated with a third subrange of the particular wavelength range.

As further shown in FIG. 1B, the first light beams 116 may pass through the optical element 102 and transmit to the optical filter 104. The optical element 102 may redirect a trajectory of the first light beams 116 and may cause the first light beams 116 to fall incident on the first region 110-1 of the optical filter 104 within a first incidence angle range. For example, the optical element 102 may cause the first light beams 116 to fall incident on the first region 110-1 of the optical filter 104 at a first incidence angle 118 (e.g., which is within the first incidence angle range).

As further shown in FIG. 1B, a first channel 108-1, of a set of first channels 108 that are included in the first region 110-1, may receive a portion of the first light beams 116 that fall incident on the first region 110-1. For example, the first channel 108-1 may receive the first set of first light beams 116-1, the second set of first light beams 116-2, and the third set of first light beams 116-3, which may fall incident on the first channel 108-1 at the first incidence angle 118.

The first channel 108-1 may be configured to pass light beams associated with the particular wavelength range (e.g., the same wavelength range that is associated with the first light beams 116). Due to an angle-dependent wavelength characteristic of the first channel 108-1, the first channel 108-1 may be configured to pass light beams associated with a particular subrange of the particular wavelength range when the light beams fall incident on the first channel 108-1 within the first incidence angle range (e.g., when the first incidence angle 118 is greater than a lower bound of the first incidence angle range and less than or equal to an upper bound of the first incidence angle range). For example, the first channel 108-1 may be configured to pass light beams associated with the second subrange of the particular wavelength range when the light beams fall incident on the first channel 108-1 within the first incidence angle range. Accordingly, as shown in FIG. 1B, the first channel 108-1 may pass the second set of first light beams 116-2 that are associated with the second subrange of the particular wavelength range when the first incidence angle 118 is within the first incidence angle range. Additionally, or alternatively, the first channel 108-1 may prevent the first set of first light beams 116-1 that are associated with the first subrange of the particular wavelength range and/or the third set of first light beams 116-3 that are associated with the third subrange of the particular wavelength range from passing through the first channel 108-1 when the first incidence angle 118 is within the first incidence angle range.

In some implementations, the first channel 108-1 may pass light beams associated with the particular subrange of the particular wavelength range to a set of sensor elements 112 of the plurality of sensor elements 112 of the optical sensor 106 (e.g., a set of sensor elements 112 that are configured to receive light beams passed by the first channel 108-1). For example, as shown in FIG. 1B, the first channel 108-1 may pass the second set of first light beams 116-2 to a corresponding sensor element 112 of the optical sensor 106.

As shown in FIG. 1C, second light beams 120 associated with the particular wavelength range (e.g., the same wavelength range as the particular wavelength range associated with the first light beams 116) may originate at the subject 114. The second light beams 120 may comprise sets of second light beams 120 that are associated with individual subranges of the particular wavelength range. For example, as shown in FIG. 1C, a first set of second light beams 120-1 (e.g., indicated by a dashed line) may be associated with the first subrange of the particular wavelength range, a second set of second light beams 120-2 (e.g., indicated by a solid line) may be associated with the second subrange of the particular wavelength range, and a third set of second light beams 120-3 (e.g., indicated by a dashed-and-dotted line) may be associated with the third subrange of the particular wavelength range (e.g., the same subranges of the particular wavelength range that are associated with the first light beams 116, as described herein in relation to FIG. 1B).

As further shown in FIG. 1C, the second light beams 120 may pass through the optical element 102, which may redirect a trajectory of the second light beams 120 to cause the second light beams 120 to fall incident on the second region 110-2 of the optical filter 104 within a second incidence angle range. For example, the optical element 102 may cause the second light beams 120 to fall incident on the second region 11021 of the optical filter 104 at a second incidence angle 122 (e.g., which is within the second incidence angle range).

As further shown in FIG. 1C, a second channel 108-2, of a set of second channels 108 that are included in the second region 110-2, may receive a portion of the second light beams 120 that fall incident on the second region 110-2. For example, the second channel 108-2 may receive the first set of second light beams 120-1, the second set of second light beams 120-2, and the third set of second light beams 120-3, which may fall incident on the second channel 108-2 at the second incidence angle 122.

The second channel 108-2 may be similarly configured as the first channel 108-1 (e.g., the second channel 108-2 and the first channel 108-1 may be part of the same group of channels 108 and have matching compositions). Accordingly, the second channel 108-2 may be configured to pass light beams associated with the particular wavelength range (e.g., the same wavelength range that is associated with the second light beams 120). Due to an angle-dependent wavelength characteristic of the second channel 108-2, the second channel 108-2 may be configured to pass light beams associated with another particular subrange of the particular wavelength range (e.g., that is different than the particular subrange of the particular wavelength range described above in relation to FIG. 1B) when the light beams fall incident on the second channel 108-2 within the second incidence angle range (e.g., when the second incidence angle 122 is greater than a lower bound of the second incidence angle range and less than or equal to an upper bound of the second incidence angle range). For example, the second channel 108-2 may be configured to pass light beams associated with the third subrange of the particular wavelength range when the light beams fall incident on the second channel 108-2 within the second incidence angle range. Accordingly, as shown in FIG. 1C, the second channel 108-2 may pass the third set of second light beams 120-3 that are associated with the third subrange of the particular wavelength range when the second incidence angle 122 is within the second incidence angle range. Additionally, or alternatively, the second channel 108-2 may prevent the first set of second light beams 120-1 that are associated with the first subrange of the particular wavelength range and/or the second set of second light beams 120-2 that are associated with the second subrange of the particular wavelength range from passing through the second channel 108-2 when the second incidence angle 122 is within the second incidence angle range.

In some implementations, the second channel 108-2 may pass light beams associated with the other particular subrange of the particular wavelength range to a set of sensor elements 112 of the plurality of sensor elements of the optical sensor 106 (e.g., a set of sensor elements 112 that are configured to receive second light beams passed by the second channel 108-2). For example, as shown in FIG. 1C, the second channel 108-2 may pass the third set of second light beams 120-3 to a corresponding sensor element 112 of the optical sensor 106.

In some implementations, the particular subrange of the particular wavelength range that is associated with light beams that are passed by the first channel 108-1 and the other particular subrange of the particular wavelength range that is associated with light beams that are passed by the second channel 108-2 are different (e.g., the particular subrange of the particular wavelength range and the other particular subrange of the particular wavelength range are not coextensive or are only partly coextensive). For example, the second set of first light beams 116-2 that is passed by the first channel 108-1 may be associated with a different subrange of the particular wavelength than that of the third set of second light beams 120-3 that is passed by the second channel 108-2.

Figure 1D:
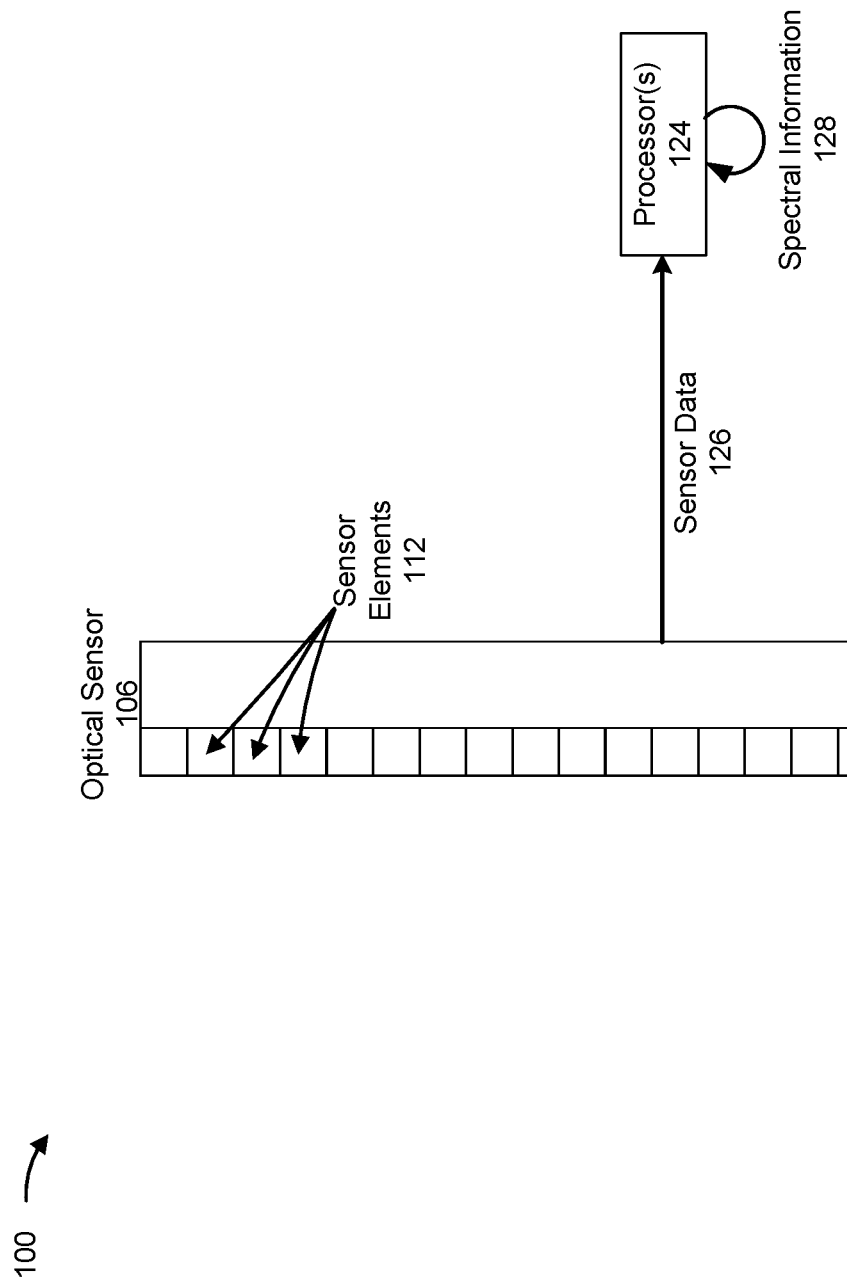

As shown in FIG. 1D, the optical sensor 106 may be associated with one or more processors 124 and may provide, as shown by reference number 126, sensor data to the one or more processors 124. The sensor data may indicate information relating to light beams originating at the subject 114 that passed through the channels 108 of the optical filter 104, such as an indication of intensity of the light beams that are received by the one or more sensor elements 112. For example, the sensor data may indicate information relating to the second set of first light beams 116-2 that was passed by the first channel 108-1 to a corresponding sensor element 112 of the optical sensor 106 (e.g., as described herein in relation to FIG. 1B) and/or information relating to the third set of second light beams 120-3 that was passed by the second channel 108-2 to a corresponding sensor element 112 of the optical sensor 106 (e.g., as described herein in relation to FIG. 1C).

As further shown in FIG. 1D, and by reference number 128, the one or more processors 124 may process the sensor data to determine spectral information associated with the subject 114. For example, the one or more processors 124 may identify, based on the sensor data, a particular sensor element 112 of the optical sensor 106 that received a light beam (e.g., a first light beam 116 or a second light beam 120). The one or more processors 124 may determine, based on configuration information associated with the optical filter 104 (e.g., that is stored in a data structure that is accessible by the one or more processors 124), that the particular sensor element 112 is associated with a particular channel 108 (e.g., the first channel 108-1 or the second channel 108-2) of the optical filter 104 (e.g., the particular sensor element 112 is configured to receive light beams passed by the particular channel 108) and may identify the particular channel 108 as having received and passed the light beam to the particular sensor element 112. Further, the one or more processors 124 may determine, based on the configuration information, that the particular channel 108 is configured to receive light beams (e.g., from the optical element 102) within a particular incidence angle range (e.g., the first incidence angle range or the second incidence angle range). Accordingly, the one or more processors 124 may determine that the light beam fell incident on the particular channel 108 within the particular incidence angle range. The one or more processors 124 therefore may determine, based on angle shift information associated with the particular channel 108 (e.g., that is stored in a same or different data structure that is accessible by the one or more processors 124) that the light beam is associated with a particular subrange of a particular wavelength range.

In some implementations, the one or more processors 124 may provide the spectral information (e.g., information indicating wavelength subranges respectively associated with light beams received by the sensor elements 112 of the optical sensor 106) to another device, such as a user device. For example, the one or more processors 124 may send the spectral information to the user device to cause the user device to display the spectral information on a display screen of the user device. As another example, the one or more processors 124 may send the spectral information to the user device to cause the user device to determine (e.g., based on the spectral information) one or more characteristics of the subject 114 (e.g., a material composition of the subject 114, a temperature of the subject 114, a health-related measurement of the subject 114, and/or the like).

Additionally, or alternatively, the one or more processors 124 may process the spectral information to determine the one or more characteristics of the subject 114.

In this way, the optical sensor device associated with the optical element 102, the optical filter 104, the optical sensor 106, and the one or more processors 124 is able to determine more accurate spectral information associated with light beams that enter the optical sensor device, as compared to a conventional optical sensor device. Moreover, the optical sensor device provides greater spectral precision over a wider set of wavelength ranges, as compared to a conventional optical sensor device.

As indicated above, FIGS. 1A-1D are provided as examples. Other examples may differ from what is described with regard to FIGS. 1A-1D.

Figure 2A:
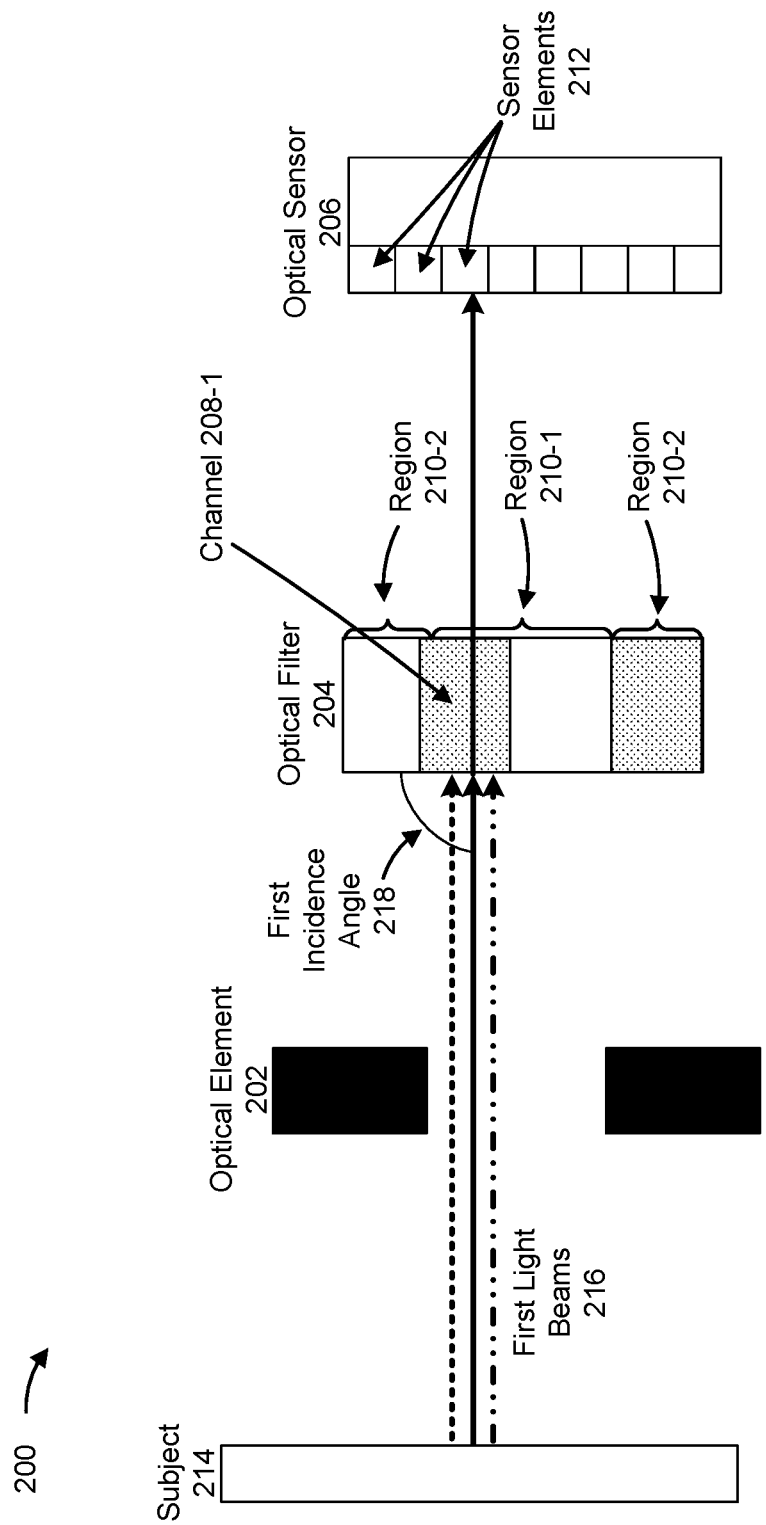
FIGS. 2A-2B are diagrams of an overview of an example implementation described herein.
Figure 2B:
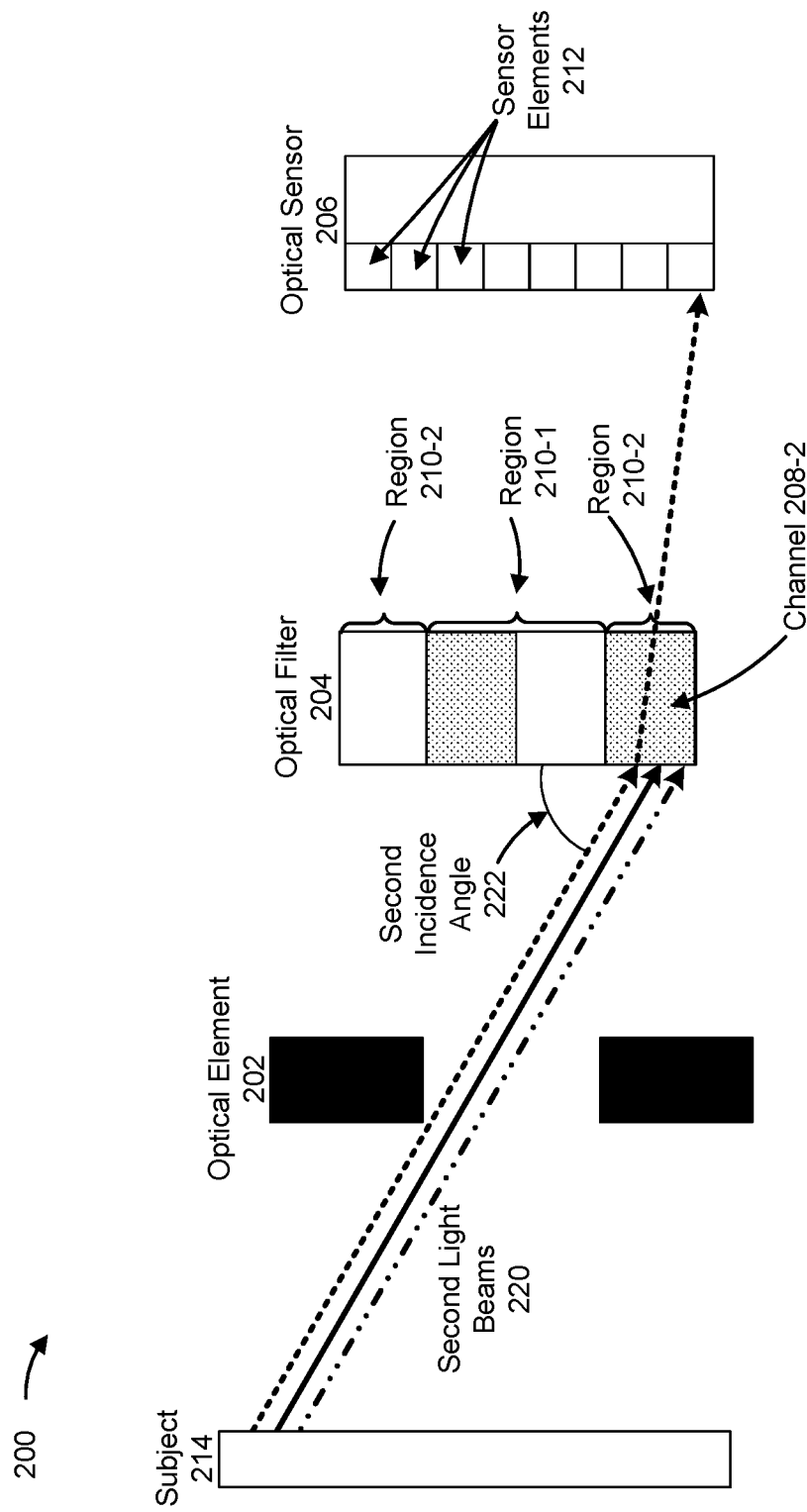

FIGS. 2A-2B are diagrams of an overview of an example implementation 200 described herein. As shown in FIGS. 2A-2B, example implementation 200 includes an optical element 202, an optical filter 204, and an optical sensor 206 that are respectively the same as or similar to the optical element 102, the optical filter 104, and the optical sensor 106 described herein in relation to FIGS. 1A-1D.

As further shown in FIGS. 2A-2B, the optical filter 204 may include a plurality of channels 208 (e.g., that are similarly configured as the plurality of channels 108 described herein in relation to FIGS. 1A-1D) that may be included in a plurality of regions 210 (e.g., that are similarly configured as the plurality of regions 110 described herein in relation to FIGS. 1A-1D) of the optical filter 204. The optical sensor 206 may include a plurality of sensor elements 212 (e.g., that are similarly configured as the plurality of sensor elements 112 described herein in relation to FIGS. 1A-1D).

As further shown in FIGS. 2A-2B, the optical element 202 may include an aperture. The optical element 202 may be disposed over the optical filter 204 and may be separated from the optical filter 204 by a free space gap. In some implementations, the optical element 202 may allow light beams that have a trajectory that is parallel to a normal line of a surface (e.g., an input surface) of the optical filter 204 to fall incident on a first region 210-1 (and not on a second region 210-2) of the optical filter 204. For example, one or more portions of the optical element 202 may be disposed over the second region 210-2 and not over the first region 210-1.

Accordingly, as shown in FIG. 2A, first light beams 216 (e.g., that are similar to the first light beams 116 described herein in relation to FIG. 1B) that originate from a subject 214 and that are associated with a particular wavelength range may pass through the optical element 202 and may transmit to the optical filter 204 (e.g., when an origination point of the first light beams 216 is aligned with the first region 210-1 of the optical filter 204 along the normal line of the surface of the optical filter 204). For example, the first light beams 216 may fall incident on the first region 210-1 of the optical filter 104 at a first incidence angle 218 (e.g., which is within a first incidence angle range). A first channel 208-1 that is included in the first region 210-1 may be configured to pass light beams associated with the particular wavelength range and may receive a portion of the first light beams 216 that fall incident on the first region 210-1. Due to an angle-dependent wavelength characteristic of the first channel 208-1, the first channel 208-1 may be configured to pass light beams associated with a particular subrange of the particular wavelength range when the light beams fall incident on the first channel 208-1 within the first incidence angle range. Accordingly, the first channel 208-1 may pass a set of the first light beams 216 associated with the particular subrange of the particular wavelength range to a set of sensor elements 212 of the plurality of sensor elements of the optical sensor 206 (e.g., in a similar manner as that described herein in relation to FIG. 1B).

Further, as shown in FIG. 2B, second light beams 220 (e.g., that are similar to the second light beams 120 described herein in relation to FIG. 1C) that originate from the subject 214 and that are associated with the particular wavelength range may pass through the optical element 202 and may transmit to the optical filter 204 (e.g., when an origination point of the first light beams 216 is not aligned with the first region 210-1 of the optical filter 204 along the normal line of the surface of the optical filter). For example, the second light beams 220 may fall incident on the second region 210-2 of the optical filter 104 at a second incidence angle 222 (e.g., which is within a second incidence angle range). A second channel 208-2 that is included in the second region 210-2 may be configured to pass light beams associated with the particular wavelength range and may receive a portion of the second light beams 220 that fall incident on the first region 210-1. Due to an angle-dependent wavelength characteristic of the second channel 208-2, the second channel 208-2 may be configured to pass light beams associated with another particular subrange of the particular wavelength range when the light beams fall incident on the second channel 208-2 within the second incidence angle range. Accordingly, the second channel 208-2 may pass a set of the second light beams 220 associated with the other particular subrange of the particular wavelength range to a set of sensor elements 212 of the plurality of sensor elements of the optical sensor 206 (e.g., in a similar manner as that described herein in relation to FIG. 1C).

As indicated above, FIGS. 2A-2B are provided as examples. Other examples may differ from what is described with regard to FIGS. 2A-2B.

Figure 3:
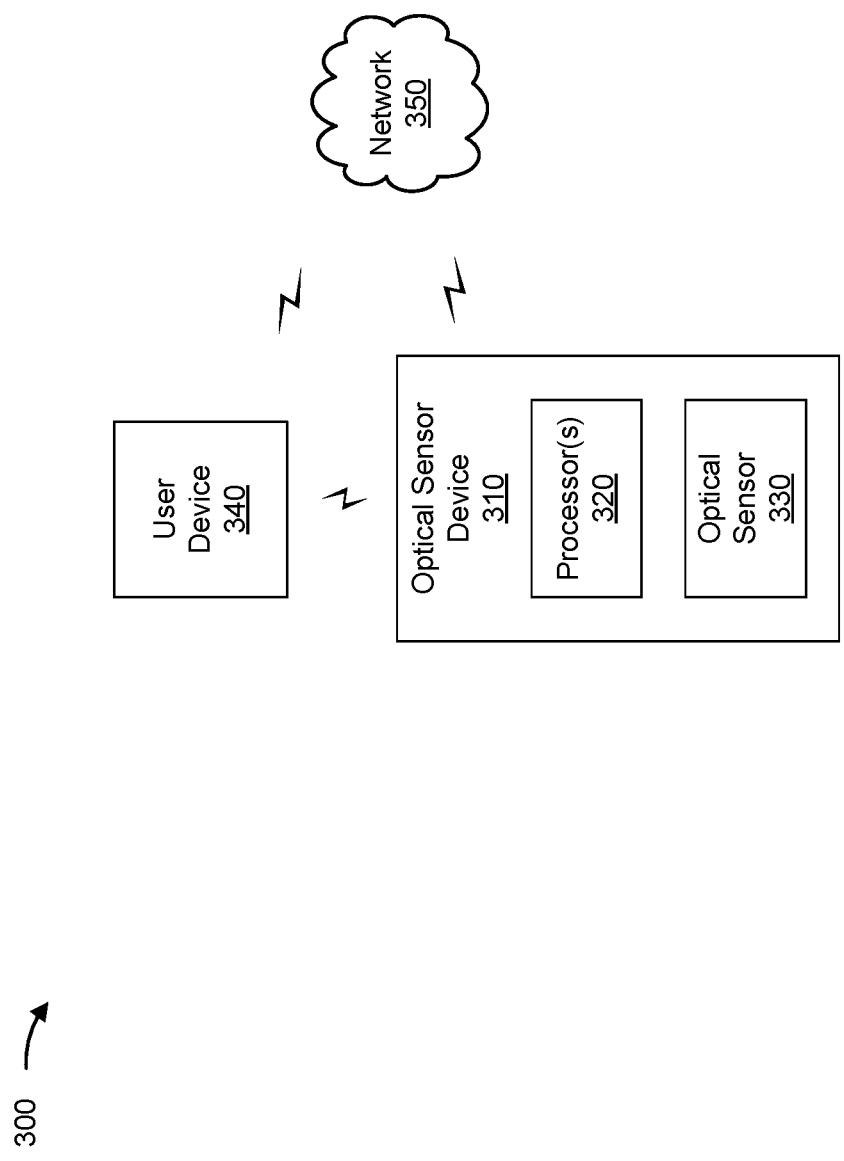
FIG. 3 is a diagram of an example environment in which systems and/or methods described herein may be implemented.

FIG. 3 is a diagram of an example environment 300 in which systems and/or methods described herein may be implemented. As shown in FIG. 3, environment 300 may include an optical sensor device 310 that may include one or more processors 320 (e.g., that correspond to the one or more processors 124 described herein in relation to FIG. 1D) and an optical sensor 330 (e.g., that corresponds to the optical sensor 106 described herein in relation to FIGS. 1A-1D and/or the optical sensor 206 described herein in relation to FIGS. 2A-2B). The environment 300 may also include a user device 340 and a network 350. Devices of environment 300 may interconnect via wired connections, wireless connections, or a combination of wired and wireless connections.

Optical sensor device 310 may include an optical device capable of storing, processing, and/or routing spectral information associated with a subject. For example, optical sensor device 310 may include a spectrometer device that performs spectroscopy, such as a spectral optical sensor device (e.g., a binary multispectral optical sensor device that performs vibrational spectroscopy, such as a near infrared (NIR) spectrometer, a mid-infrared spectroscopy (mid-IR), Raman spectroscopy, and/or the like). For example, optical sensor device 310 may perform a health parameter monitoring determination, a pulse transit time determination, a biometric authentication determination, a liveness detection determination, and/or the like. In this case, optical sensor device 310 may utilize the same wavelengths, different wavelengths, a combination of the same wavelengths and different wavelengths, and/or the like for such determinations. In some implementations, optical sensor device 310 may be incorporated into user device 340, such as a wearable spectrometer and/or the like. In some implementations, optical sensor device 310 may receive information from and/or transmit information to another device in environment 300, such as user device 340.

In some implementations, optical sensor device 310 may comprise a spectral imaging camera. A spectral imaging camera is a device that can capture an image of a scene. A spectral imaging camera (or a processor 320 associated with the spectral imaging camera) may be capable of determining spectral content or changes in spectral content at different points in an image of a scene, such as any point in an image of a scene.

In some implementations, optical sensor device 310 may comprise a spectral imaging camera capable of performing hyperspectral imaging. For example, optical sensor device 310 may include an optical filter (e.g., optical filter 104, described herein in relation to FIGS. 1A-1D, and/or optical filter 204, described herein in relation to FIGS. 2A-2B). In some implementations, the optical filter may be disposed over the optical sensor 330. In some implementations, optical sensor device 310 may comprise an optical element (e.g., optical element 102, described herein in relation to FIGS. 1A-1D and/or optical element 202, described herein in relation to FIGS. 2A-2B). For example, the optical element may be configured to cause light beams associated with the subject to fall incident on a surface (e.g., an input surface) of the optical filter at different incidence angles when the light beams are en route to optical sensor 330. In some implementations, the optical element may be disposed over the optical filter.

Optical sensor device 310 may include one or more processors 320, described in more detail in connection with FIG. 4.

Optical sensor device 310 may include an optical sensor 330. Optical sensor 330 includes a device capable of sensing light. For example, optical sensor 330 may include an image sensor, a multispectral sensor, a spectral sensor, and/or the like. In some implementations, optical sensor 330 may include a silicon (Si) based sensor, an indium-gallium-arsenide (InGaAs) based sensor, a lead-sulfide (PbS) based sensor, or a germanium (Ge) based sensor, and may utilize one or more sensor technologies, such as a complementary metal-oxide-semiconductor (CMOS) technology, or a charge-coupled device (CCD) technology, among other examples. In some implementations, optical sensor 330 may include a front-side illumination (FSI) sensor, a back-side illumination (BSI) sensor, and/or the like. In some implementations, optical sensor 330 may be included in a camera of optical sensor device 310 and/or user device 340.

User device 340 includes one or more devices capable of receiving, generating, storing, processing, and/or providing the spectral information associated with the subject. For example, user device 340 may include a communication and/or computing device, such as a mobile phone (e.g., a smart phone, a radiotelephone, and/or the like), a computer (e.g., a laptop computer, a tablet computer, a handheld computer, and/or the like), a gaming device, a wearable communication device (e.g., a smart wristwatch, a pair of smart eyeglasses, and/or the like), or a similar type of device. In some implementations, user device 340 may receive information from and/or transmit information to another device in environment 300, such as optical sensor device 310.

Network 350 includes one or more wired and/or wireless networks. For example, network 350 may include a cellular network (e.g., a long-term evolution (LTE) network, a code division multiple access (CDMA) network, a 3G network, a 4G network, a 5G network, another type of next generation network, and/or the like), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 3 are provided as an example. In practice, there may be additional devices and/or networks, fewer devices and/or networks, different devices and/or networks, or differently arranged devices and/or networks than those shown in FIG. 3. Furthermore, two or more devices shown in FIG. 3 may be implemented within a single device, or a single device shown in FIG. 3 may be implemented as multiple, distributed devices. For example, although optical sensor device 310 and user device 340 are described as separate devices, optical sensor device 310 and user device 340 may be implemented as a single device. Additionally, or alternatively, a set of devices (e.g., one or more devices) of environment 300 may perform one or more functions described as being performed by another set of devices of environment 300.

Figure 4:
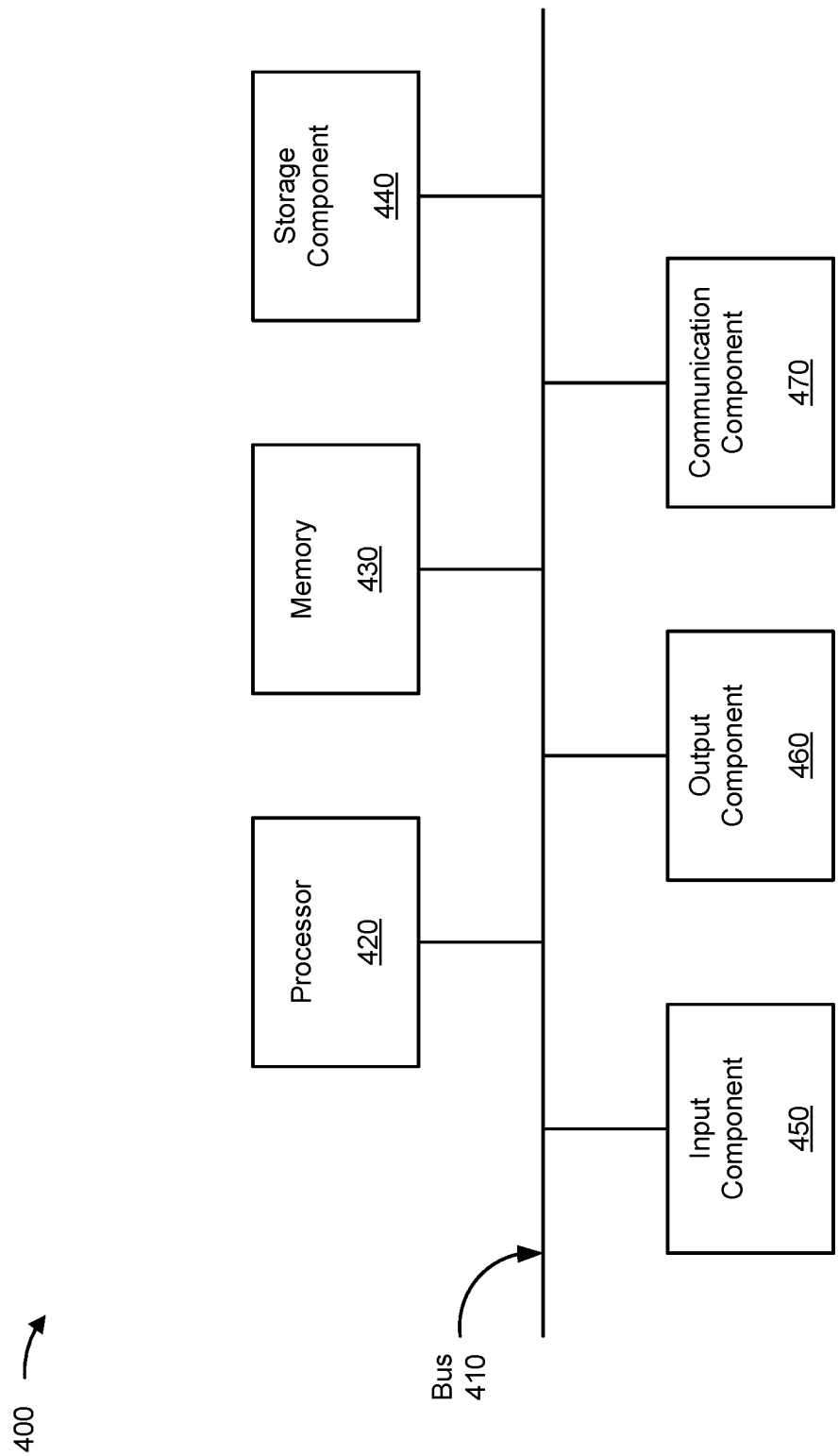
FIG. 4 is a diagram of example components of one or more devices of FIG. 3.

FIG. 4 is a diagram of example components of a device 400. Device 400 may correspond to optical sensor device 310 and/or user device 340. In some implementations, optical sensor device 310 and/or user device 340 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a component for determining location (e.g., a global positioning system (GPS) component) and/or a sensor (e.g., an accelerometer, a gyroscope, an actuator, another type of positional or environmental sensor, and/or the like). Output component 460 includes a component that provides output information from device 400 (via, e.g., a display, a speaker, a haptic feedback component, an audio or visual indicator, and/or the like).

Communication component 470 includes a transceiver-like component (e.g., a transceiver, a separate receiver, a separate transmitter, and/or the like) that enables device 400 to communicate with other devices, such as via a wired connection, a wireless connection, or a combination of wired and wireless connections. Communication component 470 may permit device 400 to receive information from another device and/or provide information to another device. For example, communication component 470 may include an Ethernet interface, an optical interface, a coaxial interface, an infrared interface, a radio frequency (RF) interface, a universal serial bus (USB) interface, a Wi-Fi interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions may be read into memory 430 and/or storage component 440 from another computer-readable medium or from another device via communication component 470. When executed, software instructions stored in memory 430 and/or storage component 440 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
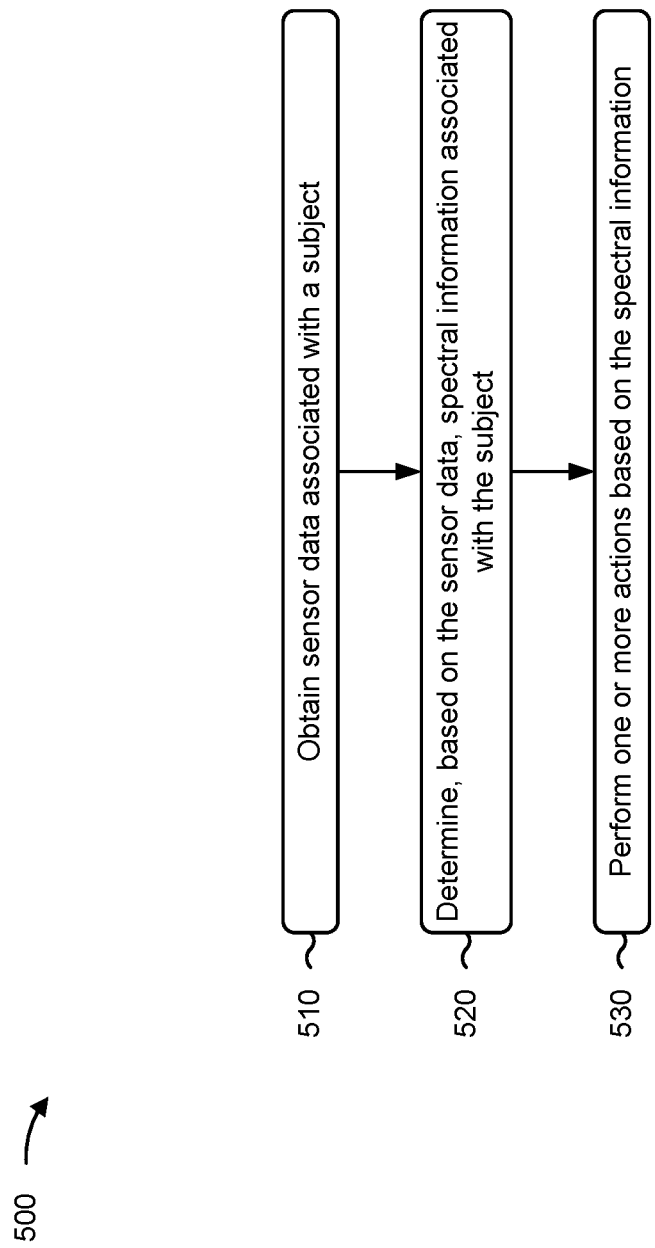
FIG. 5 is a flowchart of an example process relating to an optical sensor device.

FIG. 5 is a flowchart of an example process 500 associated with an optical sensor device (e.g., optical sensor device 310). In some implementations, one or more process blocks of FIG. 5 may be performed by one or more processors (e.g., one or more processors 124 or one or more processors 320) of the optical sensor device. In some implementations, one or more process blocks of FIG. 5 may be performed by another device or a group of devices separate from or including the one or more processors, such as a user device (e.g., user device 340). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include obtaining sensor data associated with a subject (block 510). For example, the one or more processors may obtain sensor data associated with a subject, as described above.

As further shown in FIG. 5, process 500 may include determining, based on the sensor data, spectral information associated with the subject (block 520). For example, the one or more processors may determine, based on the sensor data, spectral information associated with the subject, as described above.

In some implementations, determining the spectral information associated with the subject includes identifying, based on the sensor data, a particular sensor element, of the first subset of sensor elements, that received at least one first light beam of the set of the first light beams from the first channel; and determining, based on configuration information associated with the optical filter, that the at least one first light beam is associated with the first subrange of the particular wavelength range. In some implementations, determining the spectral information associated with the subject includes identifying, based on the sensor data, a particular sensor element, of the second subset of sensor elements, that received at least one second light beam of the set of the second light beams from the second channel; determining, based on configuration information associated with the optical filter, an incidence angle range of the at least one second light beam on the second channel; and determining, based on the incidence angle range of the at least one second light beam and angle shift information associated with the second channel, that the at least one second light beam is associated with the second subrange of the particular wavelength range.

As further shown in FIG. 5, process 500 may include performing one or more actions based on the spectral information (block 530). For example, the one or more processors may perform one or more actions based on the spectral information, as described above.

In some implementations, the one or more actions include causing display of the spectral information on a display screen associated with the optical sensor device and/or determining, based on the spectral information, at least one of a temperature of the subject, a material composition of the subject, or a health-related measurement of the subject.

Process 500 may include additional implementations, such as any single implementation or any combination of implementations described in connection with one or more other processes described elsewhere herein.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An optical sensor device, comprising:
an optical element;
an optical sensor that includes a set of sensor elements; and
an optical filter including:
a first region including a first channel,
wherein the first channel is configured to:
receive, from the optical element, first light beams that fall incident on the first region within a first incidence angle range, and
pass, to a first subset of sensor elements of the set of sensor elements, a subset of the first light beams that are associated with a first subrange of the first incidence angle range, and
a second region including a second channel,
wherein the second channel is configured to:
receive, from the optical element, second light beams that fall incident on the second region with a second incidence angle range, and
pass, to a second subset of sensor elements of the set of sensor elements, a subset of the second light beams that are associated with a second subrange of the second incidence angle range.

2. The optical sensor device of claim 1, wherein the optical element includes a non-telecentric lens.

3. The optical sensor device of claim 1, wherein the first subrange of the first incidence angle range and the second subrange of the second incidence angle range are not coextensive.

4. The optical sensor device of claim 1, wherein the optical filter is directly disposed on the optical sensor.

5. The optical sensor device of claim 1, wherein the optical element is disposed over the optical sensor, and
wherein the optical element and the optical filter are separated by a gap.

6. The optical sensor device of claim 1, wherein a first incidence angle of the first incidence angle range is greater than a second incident angle of the second incidence angle range.

7. The optical sensor device of claim 1, wherein the first region is an outer region of the optical filter, and
wherein the second region is an inner region of the optical filter.

8. An optical system, comprising:
an optical element; and
an optical filter including:
a first channel configured to:
receive, from the optical element, first light beams that fall incident on a first region within a first incidence angle range, and
pass, to a first subset of sensor elements of an optical sensor, a subset of the first light beams that are associated with a first subrange of the first incidence angle range, and
a second channel configured to:
receive, from the optical element, second light beams that fall incident on a second region with a second incidence angle range, and
pass, to a second subset of sensor elements of the optical sensor, a subset of the second light beams that are associated with a second subrange of the second incidence angle range.

9. The optical system of claim 8, wherein the optical element comprises one or more of an aperture or a non-telecentric lens.

10. The optical system of claim 8, wherein the first channel comprises a first set of thin film layers,
wherein the second channel comprises a second set of thin film layers, and
wherein a composition of the first set of thin film layers matches a composition of the second set of thin film layers.

11. The optical system of claim 8, wherein the first subrange of the first incidence angle range and the second subrange of the second incidence angle range are partly coextensive.

12. The optical system of claim 8, wherein the optical element and the optical filter are separated by a gap.

13. The optical system of claim 8, wherein a first incidence angle of the first incidence angle range is greater than a second incidence angle of the second incidence angle range.

14. The optical system of claim 8, wherein the first channel is located in an outer region of the optical filter, and
wherein the second channel is located in an inner region of the optical filter.

15. An optical filter, comprising:
a first region including a first channel,
wherein the first channel is configured to:
receive first light beams that fall incident on the first region within a first incidence angle range, and
pass, to a first subset of sensor elements of an optical sensor, a subset of the first light beams that are associated with a first subrange of the first incidence angle range; and
a second region including a second channel,
wherein the second channel is configured to:
receive second light beams that fall incident on the second region with a second incidence angle range, and
pass, to a second subset of sensor elements of the optical sensor, a subset of the second light beams that are associated with a second subrange of the second incidence angle range.

16. The optical filter of claim 15, wherein the optical filter comprises a thin film optical interference filter.

17. The optical filter of claim 15, wherein the first subrange of the first incidence angle range and the second subrange of the second incidence angle range are not coextensive.

18. The optical filter of claim 15, wherein a first incidence angle of the first incidence angle range is greater than a second incidence angle of the second incidence angle range.

19. The optical filter of claim 15, wherein the first region is an outer region of the optical filter, and
wherein the second region is an inner region of the optical filter.

20. The optical filter of claim 15, wherein the first region includes a first plurality of channels that include the first channel,
wherein the second region includes a second plurality of channels that include the second channel, and
wherein the first plurality of channels is greater in quantity than the second plurality of channels.

* * * * *